United States Patent
Kaplan et al.

[11] Patent Number: 5,573,875
[45] Date of Patent: Nov. 12, 1996

[54] LASER ABLATION MASK AND METHOD OF FABRICATION

[75] Inventors: Leon H. Kaplan, Yorktown Heights; Doris P. Pulaski, Holmes, both of N.Y.

[73] Assignee: International Business Machines Corporation, Armonk, N.Y.

[21] Appl. No.: 569,321

[22] Filed: Dec. 8, 1995

Related U.S. Application Data

[63] Continuation of Ser. No. 220,759, Mar. 30, 1994, abandoned.

[51] Int. Cl.⁶ .................................................. G03F 9/00
[52] U.S. Cl. .................... 430/5; 430/313; 156/659.1; 428/141
[58] Field of Search .................. 430/5, 313; 156/659.1; 428/141

[56] References Cited

U.S. PATENT DOCUMENTS

| | | | |
|---|---|---|---|
| 4,414,059 | 11/1983 | Blum et al. | 156/659.1 |
| 4,882,214 | 11/1989 | Hecq | 428/141 |
| 4,923,772 | 5/1990 | Kirch et al. | 430/5 |
| 5,039,186 | 8/1991 | Man et al. | 385/122 |
| 5,061,874 | 10/1991 | Hecq et al. | 313/478 |
| 5,093,883 | 3/1992 | Yoon et al. | 385/130 |
| 5,328,785 | 7/1994 | Smith et al. | 430/322 |

FOREIGN PATENT DOCUMENTS

0624471A2  12/1993  European Pat. Off. .

OTHER PUBLICATIONS

W. M. Moreau, et al., "Dielectric Photomasks" IBM Technical Disclosure Bulletin, vol. 13, No. 1, p. 158, Jun. 1970.
Anonymous, "Controlling Sidewall Angle on Laser Ablated Holes" Research Disclosure, No. 336, Apr. 1992.

*Primary Examiner*—S. Rosasco
*Attorney, Agent, or Firm*—Charles W. Peterson, Jr.; Susan M. Murray

[57] ABSTRACT

A laser ablation mask and a method of fabrication therefor. The mask has a pattern of clear areas and scattering areas. The scattering areas are covered with randomly formed facets. The facets act as scattering centers. Areas clear of facets transmit laser energy. Scattering areas refract laser energy. Laser energy directed at the mask, will pass through the clear mask areas to selectively ablate an organic layer placed opposite the mask. However, laser energy is scattered when striking and passing through the scattering areas such that insufficient laser energy passes directly through the mask to reach the organic layer for ablation to occur. The mask is formed by depositing and patterning a metal mask layer on a quartz plate. The patterned mask layer protects intended clear areas. Scattering areas are formed in unprotected plate areas by subjecting the plate to a polymethacrylic acid/bifluoride solution.

25 Claims, 1 Drawing Sheet

LASER ABLATION MASK AND METHOD OF FABRICATION

CROSS REFERENCE TO RELATED APPLICATION

This application is a continuation of U.S. Ser. No. 08/220,759, filed Mar. 30, 1994, and entitled "Laser Ablation Mask and Method of Fabrication", now abandoned.

RELATED INVENTION

The present invention is related to U.S. patent application Ser. No. 08/220,776 entitled "LASER ABLATION MASK REPAIR METHOD" filed concurrently with this application, assigned to the assignee of the present invention and incorporated herein by reference.

1. Field of the Invention

The present invention is related to non-contact masks of the type used for projection etching and, more particularly, to non-contact masks of the type used for laser ablation patterning.

2. Background of the Invention

Patterning of areas in an organic layer using laser ablation is known. The organic layer is, typically, an insulation layer between two wiring planes. Via holes are opened through the organic layer for connecting wires on one level to wires on the other level. U.S. Pat. No. 4,414,059 entitled "Far UV Patterning of Resist Materials" to Blum, et al, assigned to the assignee of the present invention and incorporated herein by reference, teaches a technique for forming patterns in an organic layer using laser ablation. Essentially, laser energy, striking the organic layer, imparts sufficient energy to break chemical bonds within the layer. The organic layer volume expands locally in the area where the bonds are broken. The localized swelling forcibly expels fragmented portions from the organic layer. A mask defines the area of the organic layer to be irradiated.

Laser ablation requires different masks than those used for optical patterning. For non ablation photolithographic (optical) techniques, an opaque pattern is formed on a transparent substrate. Typically, the optical mask is used to form a pattern in photoresist. The photoresist pattern is used to form a pattern in an underlying layer, such as for a wiring plane or an integrated circuit chip layer. However, lasers are seldom employed to expose the photoresist and, when lasers are used, the laser energy is a fraction of that required for laser ablation. However, the material used to form the opaque pattern, e.g., chromium, absorbs laser energy. So, when these optical masks were used for laser ablation, the opaque areas of the optical mask were damaged or destroyed when the organic layer was ablated. Consequently, instead of forming the pattern in the organic layer, the mask is destroyed.

So, for prior art laser ablation masks, the opaque pattern is formed from other materials such as dielectric. U.S. Pat. No. 4,923,772 to Kirch, et al, entitled "High Energy Laser Mask and Method of Making Same" assigned to the assignee of the present invention, and incorporated herein by reference, teaches making a laser ablation mask pattern from multiple dielectric layers. The multiple dielectric layers have alternating high and low indices of refraction that, when overlayed, result in opaque mask areas that exhibit maximum reflectivity of laser energy. As taught by Kirch, et al, making these dielectric masks is a complicated, multistep process. For this reason, dielectric laser ablation masks are expensive.

PURPOSES OF THE INVENTION

It is a purpose of the invention to reduce laser ablation mask cost.

It is another purpose of this invention to simplify fabrication of laser ablation masks.

It is still another purpose of this invention to simplify laser ablation masks.

SUMMARY OF THE INVENTION

The present invention is a low cost laser ablation mask and the method of mask fabrication. The mask is a quartz substrate with the mask pattern formed on at least one surface. The pattern is formed of clear areas and scattering areas. The scattering areas are covered with random facets to scatter laser energy. Laser energy directed towards the mask, striking the clear areas passes through the mask to selectively ablate an organic layer positioned adjacent the mask. Laser energy striking the randomly facetted scattering areas is scattered, preventing ablation of the organic layer. The method of forming the laser ablation mask comprises the steps of: a) forming a protective layer on a surface of a substrate or plate; b) forming a pattern in the protective layer by selectively exposing areas of the surface; c) forming scattering centers in the exposed surface areas, said exposed surface areas forming a mask pattern; and d) removing the patterned protective layer.

DETAILED DESCRIPTION OF THE PREFERRED EMBODIMENT

Figure 1A:
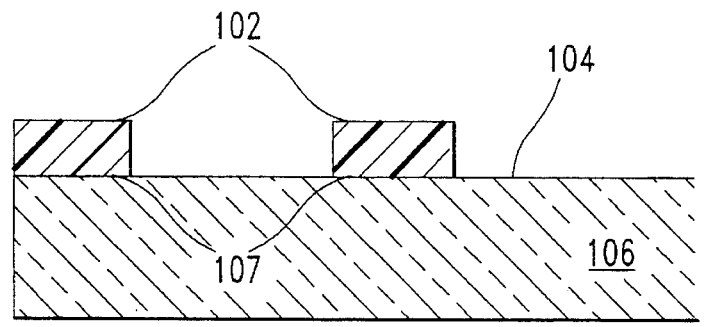
FIGS. 1A–B represent a laser ablation mask according to the preferred embodiment of the present invention, and the steps in forming the mask.
Figure 1B:
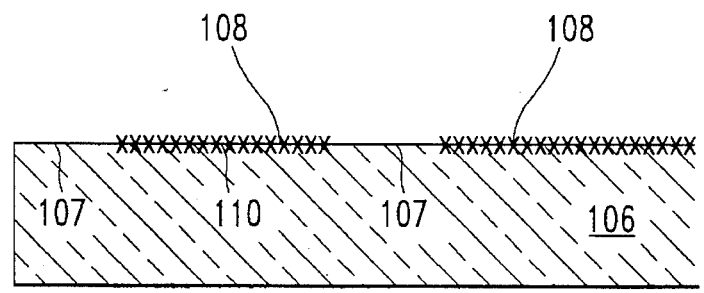

FIGS. 1A–B provide a cross-sectional view of a laser ablation mask 100 according to the preferred embodiment. A defining pattern 102, which is the negative of the mask pattern, is formed on one surface 104 of a mask substrate or plate 106. The plate 106 is transparent to laser energy and, preferably, is quartz. The defining pattern 102 will protect the underlying plate surface 104 from etchant and thus defines clear areas 107. Areas not covered by the defining pattern will be randomly facetted to form scattering areas 108. These random facets are referred to herein as scattering centers. The defining pattern is formed in a thin layer of protective material, such as chromium, that is deposited on the plate 106. The protective material is chosen such that it is impervious to the etchant solution selected to etch the plate 104. The defining pattern is photolithographically defined. Any appropriate photolitograpic process that will adequately form the defining pattern in the protective material layer may be used to form the defining pattern.

Once the defining pattern 102 is formed, scattering centers are etched to form scattering areas 108 in FIG. 1B. The preferred etchant, which is a slurry of polymethacrylic acid and, preferably, ammonium bifluoride is spun onto the substrate 106. Alternatively, potassium bifluoride may be substituted for ammonium bifluoride. The water based slurry solution contains polymethacrylic acid 20 g/l as film former with 300 g/l of the selected bifluoride. The slurry etches the exposed substrate surface in the scattering areas 108 forming random scattering centers (random facets). To further accelerate etch, the temperature of plate 106 is elevated to 150° C. Optionally, to reduce water loss from the slurry during etch, the slurry coated plate 106 is placed in a covered container, and the covered container is baked in an oven to elevate the plate's temperature. As disclosed in U.S. Pat. No. 4,882,214 to Hecq entitled "Matted Glass" and incorporated herein by reference, random facets 110 are formed in the surface of the scattering areas 108. Because a film forms on the pattern surface 104 when the slurry is spun on, similar to spinning on a photoresist layer, facets are formed in only one substrate surface 104. Finally, the slurry is washed off and the defining pattern 102 is removed, uncovering the clear areas 107. Thus, the ablation pattern is defined by the clear areas 107 and scattering areas 108.

Figure 2:
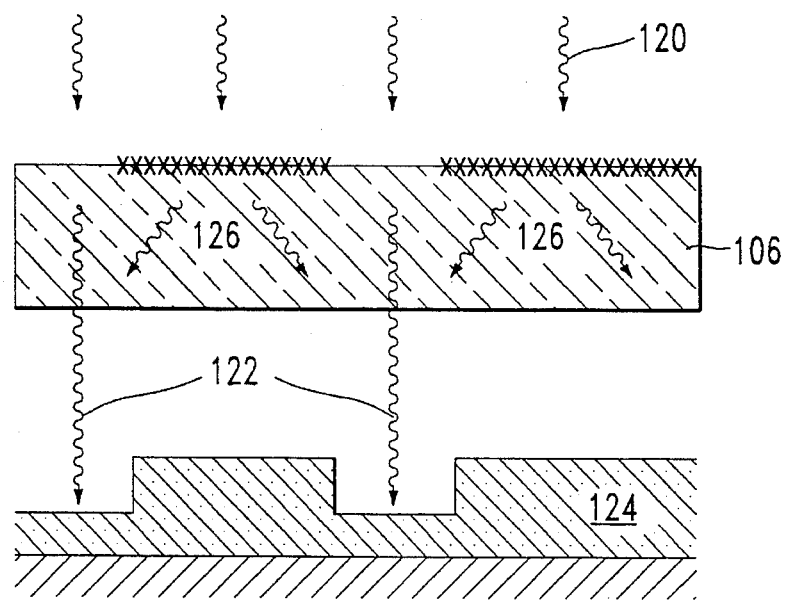
FIG. 2 represents using the preferred embodiment laser ablation mask.

As depicted in FIG. 2, when the preferred embodiment mask is irradiated with laser energy 120, the laser 122 passes through the clear areas 107 and ablates underlying organic layer 124. However, the scattering areas 108 scatter the laser energy 126, preventing sufficient focussed energy from passing through the mask and, consequently, preventing organic layer ablation under the scattering areas. The plate 106 thus provided with a pattern of clear areas 107 and scattering areas 108 is a simple, low-cost laser ablation mask.

While the present invention has been described in terms of preferred embodiments, numerous variations and alterations will occur to a person skilled in the art without departing from the spirit or scope of the invention. It is intended that the appended claims include all such variations and modifications.

We claim:

1. A method of forming a laser ablation mask, said method comprising the steps of:
   a) forming a protective layer on one surface of a plate;
   b) forming within said protective layer a defining pattern, the defining pattern for selectively defining on the one surface of the plate a plurality of exposed areas and a plurality of protected areas, the exposed areas corresponding to the mask areas intended to scatter laser light, the protected areas corresponding to mask areas intended to pass laser light;
   c) substantially covering said one surface at said exposed areas with random facets, so as to form scattering areas for scattering laser light projected thereon; and,
   d) removing said defining pattern, thereby forming the laser ablation mask.

2. The method of claim 1 wherein the step (c) of substantially covering said one surface at said selectively exposed areas with random facets comprises etching said exposed areas of said surface with an acid solution.

3. The method of claim 2 wherein said acid solution includes polymethacrylic acid.

4. The method of claim 3 wherein the acid solution comprises a solution of 300 g/l of ammonium bifluoride and 20 g/l of polymethacrylic acid.

5. The method of claim 3 wherein said acid solution comprises a solution of 300 g/l of potassium bifluoride and 20 g/l of polymethacrylic acid.

6. The method of claim 2 wherein the exposed surface is etched in a covered container at a temperature of 150° C.

7. A laser ablation mask, the laser ablation mask having a first surface and a second opposing surface, the laser ablation mask having a mask pattern comprised of:

a plurality of clear areas, said clear areas allowing laser energy transmission sufficient to ablate an organic layer; and
   a plurality of scattering areas in said first surface, said scattering areas being substantially covered with random facets, said scattering areas refracting sufficient laser energy to impede ablation,
   whereby, a pulsed laser having a predetermined energy striking said first surface of said mask exits said second opposing mask surface with substantially the same energy in said clear areas and at a substantially reduced energy in said scattering areas.

8. The laser ablation mask of claim 7 further comprising a plate, said plate being transparent to laser energy, said plate containing said laser ablation mask pattern.

9. A laser ablation mask comprising:
   a plate; and
   a mask pattern on one surface of said plate, said mask pattern comprising a plurality of clear areas and a plurality of scattering areas, said scattering areas being substantially covered with random facets,
   whereby laser energy passes through said plate at said clear areas sufficient to ablate an organic layer and laser energy is scattered at said scattering areas such that said scattered laser energy is insufficient to ablate an organic layer.

10. The laser ablation mask of claim 9 wherein said plate comprises a quartz plate.

11. The laser ablation mask of claim 9 wherein said mask pattern consists of a plurality of clear areas and a plurality of scattering areas.

12. A method of forming a laser ablation mask, said method comprising the steps of:
   a) forming a protective layer on one surface of a plate;
   b) forming within said protective layer a defining pattern, the defining pattern for selectively defining on the one surface of the plate a plurality of exposed areas and a plurality of protected areas, the exposed areas corresponding to the mask areas intended to scatter laser light, the protected areas corresponding to mask areas intended to pass laser light;
   c) substantially covering said one surface at said exposed areas with random facets by etching the exposed areas with an acid solution in a covered container at a temperature of 150° C., so as to form scattering areas for scattering laser light projected thereon; and,
   d) removing said defining pattern, thereby forming the laser ablation mask.

13. The method of claim 12 wherein the acid solution includes polymethacrylic acid.

14. The method of claim 12 wherein the acid solution comprises a solution of 300 g/l of ammonium bifluoride and 20 g/l of polymethacrylic acid.

15. A method of forming a laser ablation mask, said method comprising the steps of:
   a) forming a protective layer on one surface of a plate;
   b) forming within said protective layer a defining pattern, the defining pattern for selectively defining on the one surface of the plate a plurality of exposed areas and a plurality of protected areas, the exposed areas corresponding to the mask areas intended to scatter laser light, the protected areas corresponding to mask areas intended to pass laser light;
   c) substantially covering said one surface at said exposed areas of the one surface with a population of merging or contiguous surface pits, so as to form scattering areas for scattering laser light projected thereon; and, d) removing the defining pattern, thereby forming the laser ablation mask.

16. The method of claim 15 wherein the step (c) of substantially covering said one surface at said exposed areas with random facets comprises etching said one surface with an acid solution.

17. The method of claim 16 wherein said acid solution includes polymethacrylic acid.

18. The method of claim 17 wherein the acid solution comprises a solution of 300 g/l of ammonium bifluoride and 20 g/l of polymethacrylic acid.

19. The method of claim 17 wherein the acid solution comprises a solution of 300 g/l of potassium bifluoride and 20 g/l of polymethacrylic acid.

20. The method of claim 16 wherein the one surface is etched in a covered container at a temperature of 150° C.

21. A laser ablation mask, the laser ablation mask having a first surface and a second opposing surface, the laser ablation mask having a mask pattern comprised of:

a plurality of clear areas, said clear areas allowing laser energy transmission sufficient to ablate an organic layer; and a plurality of scattering areas in said first surface, said scattering areas characterized by a population of merging or contiguous surface pits, said scattering areas refracting sufficient laser energy to impede ablation, whereby, a pulsed laser having a predetermined energy striking said first surface of said mask exits said second opposing mask surface with substantially the same in said clear areas and at a substantially reduced energy in said scattering areas.

22. The laser ablation mask of claim 21 further comprising a plate, said plate containing said laser ablation mask pattern.

23. A laser ablation mask comprising:

a plate; and a mask pattern on one surface of said plate, said mask pattern comprising a plurality of clear areas and a plurality of scattering areas, the scattering areas characterized by a population of merging or contiguous surface pits;

whereby laser energy passes through said plate at said clear areas sufficient to ablate an organic layer and laser energy is scattered at said scattering areas such that said scattered laser energy is insufficient to ablate an organic layer.

24. The laser ablation mask of claim 23 wherein said plate comprises a quartz plate.

25. The laser ablation mask of claim 23 wherein said mask pattern consists of a plurality of clear areas and a plurality of scattering areas.

\* \* \* \* \*